US007046539B1

(12) United States Patent
Gilkey et al.

(10) Patent No.: US 7,046,539 B1
(45) Date of Patent: May 16, 2006

(54) MECHANICAL MEMORY

(75) Inventors: Jeffrey C. Gilkey, Albuquerque, NM (US); Michelle A. Duesterhaus, Albuquerque, NM (US); Frank J. Peter, Albuquerque, NM (US); Rosemarie A. Renn, Albuquerque, NM (US); Michael S. Baker, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 64 days.

(21) Appl. No.: 10/979,419

(22) Filed: Nov. 2, 2004

(51) Int. Cl.
*G11C 5/06* (2006.01)
*B81B 7/02* (2006.01)

(52) U.S. Cl. .......................... 365/64; 365/106; 335/78
(58) Field of Classification Search .................. 365/64, 365/106, 118, 221; 335/78
See application file for complete search history.

(56) References Cited

U.S. PATENT DOCUMENTS

| 4,979,149 | A | 12/1990 | Popovic et al. |
| 5,717,631 | A | 2/1998 | Carley et al. |
| 6,082,208 | A | 7/2000 | Rodgers et al. |
| 6,133,670 | A | 10/2000 | Rodgers et al. |
| 6,211,599 | B1 | 4/2001 | Barnes et al. |
| 6,313,562 | B1 | 11/2001 | Barnes et al. |
| 6,473,361 | B1 | 10/2002 | Chen et al. |
| 6,484,545 | B1 | 11/2002 | Peter et al. |
| 6,625,047 | B1 | 9/2003 | Coleman, Jr. |
| 6,753,582 | B1 * | 6/2004 | Ma .............................. 257/415 |
| 6,803,755 | B1 * | 10/2004 | Herbert et al. ............. 324/99 R |
| 6,828,887 | B1 * | 12/2004 | Kubby et al. .................. 335/78 |
| 2004/0020968 | A1 * | 2/2004 | Howell et al. ............... 228/103 |
| 2005/0073380 | A1 * | 4/2005 | Howell et al. ............... 335/219 |
| 2005/0189204 | A1 * | 9/2005 | Yeatman et al. ............. 200/181 |
| 2006/0034562 | A1 * | 2/2006 | German et al. ................ 385/16 |

OTHER PUBLICATIONS

Beat Halg, "On a Micro-Electro-Mechanical Nonvolatile Memory Cell", IEEE Transactions on Electron Devices, vol. 37, No. 10, Oct. 1990 pp. 2230-2236.
Robert A. Freitas, Jr., "Nanomedicine, vol. 1: Basic Capabilities", Landes Bioscience, Georgetown, TX 1999, http://www.nanomedicine.com/NMI/10.2.1.htm.
Ralph C. Merkle, "Two Types of Mechanical Reversible Logic," Nanotechnology, vol. 4, 1993, pp. 114-131, http://www.zyvex.com/nanotech/mechano.html.

* cited by examiner

*Primary Examiner*—Tuan T. Nguyen
*Assistant Examiner*—Alexander Sofocleous
(74) *Attorney, Agent, or Firm*—John P. Hohimer

(57) ABSTRACT

A first-in-first-out (FIFO) microelectromechanical memory apparatus (also termed a mechanical memory) is disclosed. The mechanical memory utilizes a plurality of memory cells, with each memory cell having a beam which can be bowed in either of two directions of curvature to indicate two different logic states for that memory cell. The memory cells can be arranged around a wheel which operates as a clocking actuator to serially shift data from one memory cell to the next. The mechanical memory can be formed using conventional surface micromachining, and can be formed as either a nonvolatile memory or as a volatile memory.

11 Claims, 13 Drawing Sheets

MECHANICAL MEMORY

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical devices, and in particular to a first-in-first-out (FIFO) microelectromechanical memory device (also termed a mechanical memory) which can be fabricated either as a nonvolatile memory, or as a volatile memory.

BACKGROUND OF THE INVENTION

Memory devices are used to store information in digital form in computers and in many other types of devices in use today. Conventional memory devices may be classed as being volatile or nonvolatile. In a volatile memory device, logic state information can be stored only as long as electrical power is supplied to the volatile memory device, and is erased once the electrical power is turned off. In a nonvolatile memory device, the logic state information can be retained for months or years after the electrical power has been turned off.

The present invention is of a microelectromechanical memory apparatus that allows logic state information to be sequentially entered therein, and subsequently read out in the same sequence in which the information was entered into the device. Thus, the microelectromechanical memory apparatus of the present invention can be referred to as a first-in-first-out (FIFO) memory, or as a micromechanical memory, or simply as a mechanical memory. The mechanical memory of the present invention in different embodiments can be formed as a volatile memory or as a nonvolatile memory.

SUMMARY OF THE INVENTION

The present invention relates to a first-in-first-out (FIFO) microelectromechanical memory apparatus (also referred to herein as a mechanical memory) which comprises a substrate; a plurality of beams supported above the substrate and arranged side-by-side, with a midpoint of each beam being moveable in a direction parallel to the plane of the substrate in response to a programming force mechanically coupled to bow the beam, and with a direction of bowing of each beam indicating one of two logic states of that beam. Means are also provided on the substrate for providing the programming force to sequentially program the logic state of each beam. The substrate generally comprises silicon; and each beam generally comprises polycrystalline silicon.

The means for providing the programming force can comprise an input actuator which can further comprise an electrostatic actuator or a thermal actuator. In some embodiments of the present invention, the means for providing the programming force can comprise a wheel with a plurality of cams formed about an edge of the wheel. A microelectromechanical drive motor (also referred to herein as a micromotor) can be provided in the apparatus, with the microelectromechanical drive motor being operatively connected to rotate the wheel. The means for providing the programming force can further comprise a cantilevered beam attached to each beam near a midpoint thereof, with the cantilevered beam extending outward from each beam in a direction parallel to the plane of the substrate.

A latch can be optionally provided to engage each cantilevered beam in one of the two logic states to form a nonvolatile memory. In this case, the latch can be disengaged from each cantilevered beam to erase the nonvolatile memory.

In certain embodiments of the present invention, a data transfer beam can be provided between each pair of adjacent beams in the plurality of beams, with the data transfer beam upon actuation thereof transferring the logic state from a first beam of each pair of adjacent beams to a second beam of each pair of adjacent beams. The data transfer beam can be subsequently actuated to clear (i.e. erase) the logic state from the first beam after transfer of the logic state from the first beam to the second beam.

In some embodiments of the present invention, each beam can be initially bowed by engaging one end thereof with a latch to form a nonvolatile memory. In other embodiments of the present invention, each beam can be initially bowed by a bending actuator to form a volatile memory in which a logic state of each beam can be erased when electrical power to the bending actuator is removed. The bending actuator can comprise an electrostatic actuator, or a thermal actuator.

The first-in-first-out microelectromechanical memory apparatus of the present invention can further comprise means for sequentially reading out the logic state of each beam. The means for sequentially reading out the logic state of each beam can comprise reading out the logic state of a final beam of the plurality of beams over time, and sequentially transferring the logic state of at least a portion of the other beams to the final beam over time.

The present invention also relates to a first-in-first-out microelectromechanical memory apparatus that comprises a substrate having a plurality of curved beams spaced-apart on the substrate and suspended thereabove. Each curved beam is substantially parallel to the substrate, and is bowable in response to a clock displacement provided to one end of the curved beam, to an input displacement provided to a side of the curved beam, or to both the clock displacement and the input displacement. One direction of bowing of each curved beam represents a first logic state (e.g. a "0" logic state), with an opposite direction of bowing of the curved beam representing a second logic state (e.g. a "1" logic state). The plurality of spaced-apart curved beams also includes an input beam and an output beam. An input actuator is located proximate to the input beam to provide the input displacement to this beam, with the input displacement to the remaining curved beams being provided by a cantilevered beam attached proximate to a midpoint of an adjacent curved beam. A clocking actuator is also located on the substrate proximate to the plurality of curved beams to provide the clock displacement to each curved beam.

Output means can also be provided in the apparatus for sequentially reading out the logic state of the output beam to recover logic state information stored in the plurality of curved beams. The output means can comprise a light source for generating light, and a photodetector for detecting the light and generating a photodetector output signal therefrom, with the light being interrupted by movement of the output beam. This transfers the logic state information over time to the photodetector output signal. Alternately, the output means can comprise a capacitor formed by at least one stationary capacitor plate and at least one moveable capacitor plate located proximate to the stationary capacitor plate, with the moveable capacitor plate being operatively connected to the output beam. This produces a change in the capacitance of the capacitor in response to any movement of the output beam and thereby converts the logic state information over time into a capacitor output signal.

The substrate generally comprises silicon; and each beam can comprise polycrystalline silicon (also termed polysilicon). The input actuator can comprise an electrostatic actuator, or a thermal actuator. The clocking actuator can comprise a wheel with each curved beam being arranged radially about the wheel, and with the wheel including a plurality of cams to provide the clock displacement to each curved beam as the wheel is rotated. A micromotor can be provided on the substrate to rotate the wheel.

In some embodiments of the present invention, a latch can be provided proximate to each beam to capture and hold the beam in one of the two logic states (e.g. a logical "1" state also termed herein a "true" state). The latch can be disengaged by the clock displacement provided by the clocking actuator.

The present invention further relates to a first-in-first-out (FIFO) microelectromechanical memory apparatus which comprises a substrate; a plurality of memory cells located on the substrate; and an input actuator to program the logic state of an input memory cell of the plurality of memory cells. Each memory cell comprises a suspended beam capable of being bowed in either of two opposite directions substantially parallel to the plane of the substrate, with each direction of bowing representing a different logic state; and a data transfer beam extending outward from each suspended beam proximate to a midpoint thereof to transfer logic state information from one of the memory cells to an adjacent memory cell. The input actuator can comprise a thermal actuator, or an electrostatic actuator.

The apparatus can further comprise a clocking actuator to initiate the transfer of the logic state information from one of the memory cells to the adjacent memory cell. The clocking actuator can comprise a wheel having a plurality of cams extending outward from an edge of the wheel to push against a moveable end of each suspended beam to initiate the transfer of the logic state information from that suspended beam to an adjacent suspended beam. The clocking actuator can further comprise a micromotor which is operatively connected to rotate the wheel.

The apparatus can also comprise means for sequentially reading out the logic state information from the plurality of memory cells. In some embodiments of the present invention, the means for sequentially reading out the logic state information can comprise a light source for generating light, and a photodetector for sensing a change in the intensity of the light reaching the photodetector as the light is blocked and unblocked by movement of the data transfer beam of a final memory cell as the logic state of the final memory cell is changed over time. In sensing changes in the light intensity, the photodetector then produces an electrical output signal containing the logic state information. In other embodiments of the present invention, the means for sequentially reading out the logic state information can comprise a capacitor having at least one stationary capacitor plate and at least one moveable capacitor plate located proximate to the stationary capacitor plate. The moveable capacitor plate is operatively connected to the data transfer beam of a final memory cell to change the capacitance of the capacitor in response to a change in the logic state of the final memory cell.

In certain embodiments of the present invention where a volatile memory is to be formed from the apparatus, each memory cell can include a bending actuator which is operatively connected to one end of the suspended beam. Applying electrical power to the actuator, which can be either a thermal actuator or an electrostatic actuator, initially bows the suspended beam to program an initial logic state therein. When the electrical power to the actuator is turned off, the suspended beam is at least partially unbowed to erase any logic state information contained therein. In other embodiments of the present invention where a nonvolatile memory is to be formed from the apparatus, each memory cell can include a latch which is initially activated (e.g. with a cam) to capture and hold one end of each suspended beam. This initially bows the suspended beam and programs an initial logic state therein.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
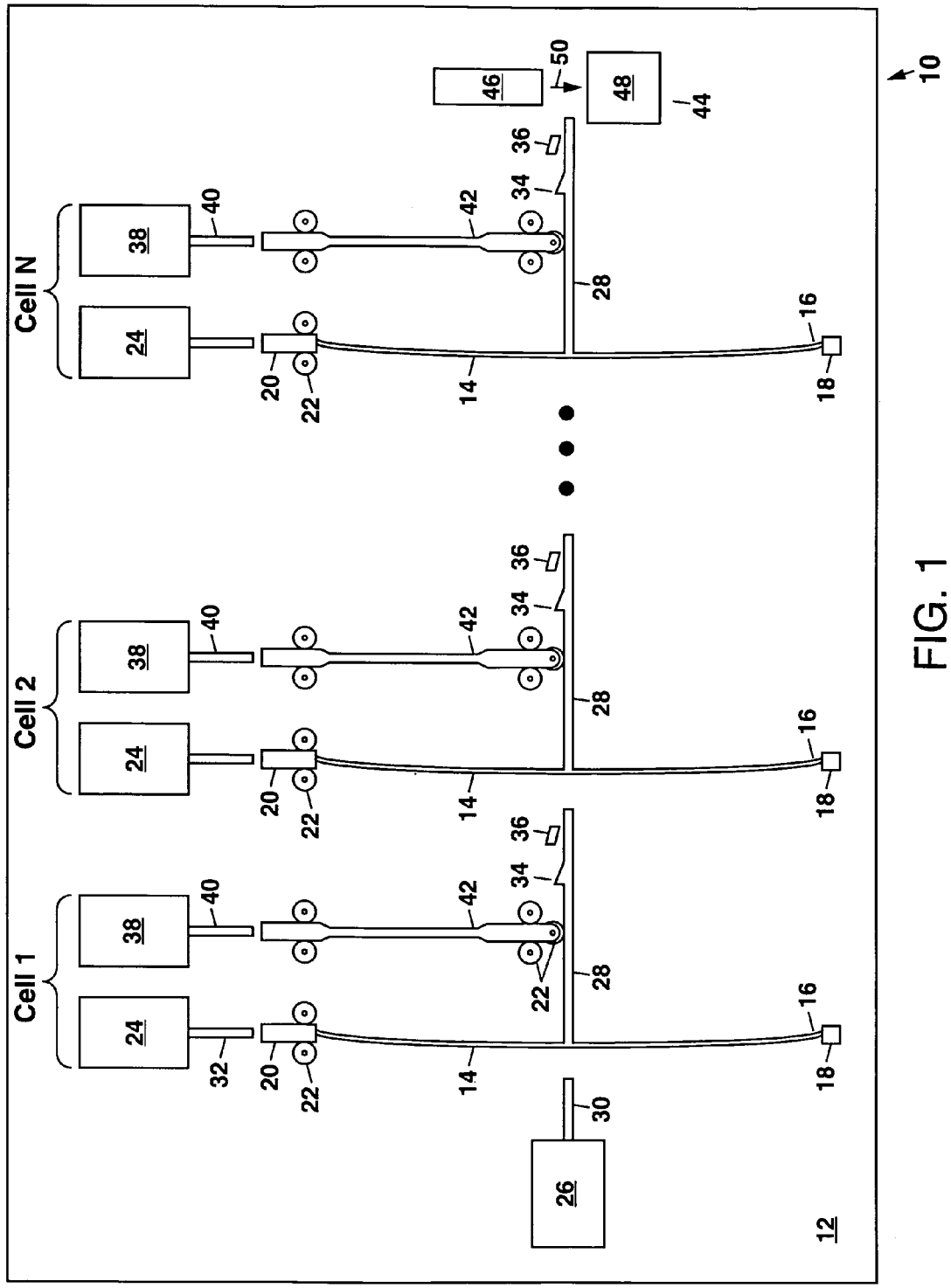
FIG. 1 shows a schematic plan view of a first example of the first-in-first-out microelectromechanical memory apparatus of the present invention.

Referring to FIG. 1, there is shown a first example of a first-in-first-out (FIFO) microelectromechanical (MEM) memory apparatus 10 according to the present invention. The apparatus 10, which is also referred to herein as a mechanical memory, comprises a substrate 12 whereon a plurality of beams 14 are formed by conventional surface micromachining as known to the art. Each beam 14 is suspended above the substrate 12 and has a fixed end 16 that is attached to the substrate 12 through an anchor 18, and a moveable end 20 which is moveable back and forth in a direction parallel to the plane of the substrate 12 (i.e. towards or away from the fixed end 16). The moveable end 20 of each beam 14 can be constrained by a pair of rollers 22 as shown in FIG. 1, or alternately by a pair of guides (not shown).

Figure 2:
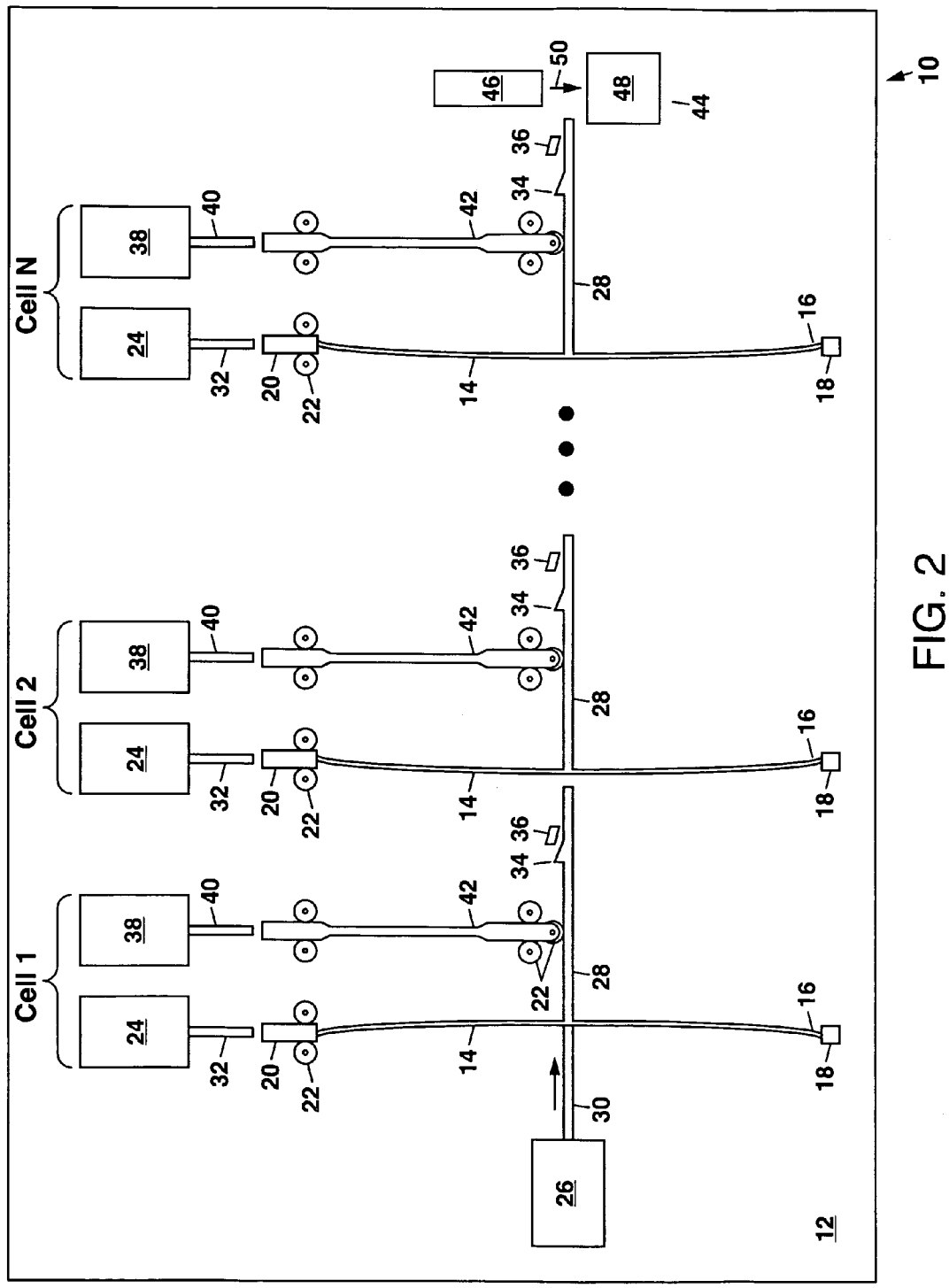
FIGS. 2–6 show schematic plan views of the device of FIG. 1 to illustrate the operation of this first example of the present invention.

Each beam 14, which can be initially bowed (i.e. curved), can move between two positions corresponding to the beam 14 being bowed to the left as shown in FIG. 1, or bowed to the right (see FIG. 2). The two directions of bowing of the beam 14 are opposite each other, and are parallel to the plane of the substrate. Each beam 14 can be formed initially bowed to the left so that the beam 14 will return to this direction of bowing unless it is latched in the opposite direction of bowing. The allows the beam 14 to function as a memory element in the memory apparatus 10 of the present invention, with each beam 14 storing one bit of information (i.e. one logic state), and with a total of N/2 bits of information being stored in N memory cells formed from by the plurality of beams 14, where N will, in general, depend upon the sizes of the substrate 12 and beams 14, and upon the memory requirement needed for a particular application.

A first logic state can be defined by a direction of bowing of each beam 14 to the left as shown in FIG. 1; and this first logic state can be equated, for example, with a logical "0" also termed a "false" state. A second logic state of each beam 14 can be defined by an opposite direction of bowing as shown in FIG. 2 for the leftmost beam 14; and this second logic state can be equated, for example, with a logical "1" state, also termed a "true" state. Switching from the first logic state to the second logic state in the example of FIG. 1 can be performed by a programming force that contacts a midpoint of each beam 14 and displaces the beam 14 to the right. The programming force, which produces an input displacement of the leftmost beam 14 in FIG. 1, can be generated using an input actuator 26 having an input arm 30 that contacts and displaces the leftmost beam 14. For the remaining beams, switching from the first logic state to the second logic state can be performed using a cantilevered beam 28 which is attached to the midpoint of an adjacent beam 14.

Operation of the mechanical memory 10 in FIG. 1 will now be described with reference to FIGS. 2–6.

As shown in FIG. 1, all the beams 14 are initially formed bowed to the left so that each memory cell 1-N of the device 10 is initially in the "0" logic state. Furthermore, each beam 14 is formed so that the beam 14 is predisposed to revert back to the "0" logic state after the beam 14 has been switched to the "1" logic state unless the beam 14 is being held or latched in the "1" logic state (e.g. by a beam 30 or 28, or by a latch 36, or by a clock displacement produced by a clocking actuator 24). The predisposition for each beam 14 to revert back to the "0" logic state can be built into each beam 14 by forming the beam 14 curved to the left so that the beam 14 acts much like a leaf spring, which has a spring constant, k, that produces a restoring force upon deflection that acts to restore the leaf spring to its undeflected position.

In FIG. 2, a bit of information is read into an input cell (i.e. Cell 1) of the mechanical memory 10 using the input actuator 26. This can be done by applying a voltage to the input actuator 26 to move an input arm 30 to the right as shown by the horizontal arrow. The extended arm 30 contacts the beam 14 of Cell 1 near its midpoint and provides a programming force which results in an input displacement of the midpoint of the beam 14, thereby bowing the beam 14 to the right and switching the beam 14 in Cell 1 from the "0" logic state to the "1" logic state. For a beam 14 having a length of 500 μm and a width of up to a few microns, the input displacement can be on the order of 10 μm.

Figure 3:
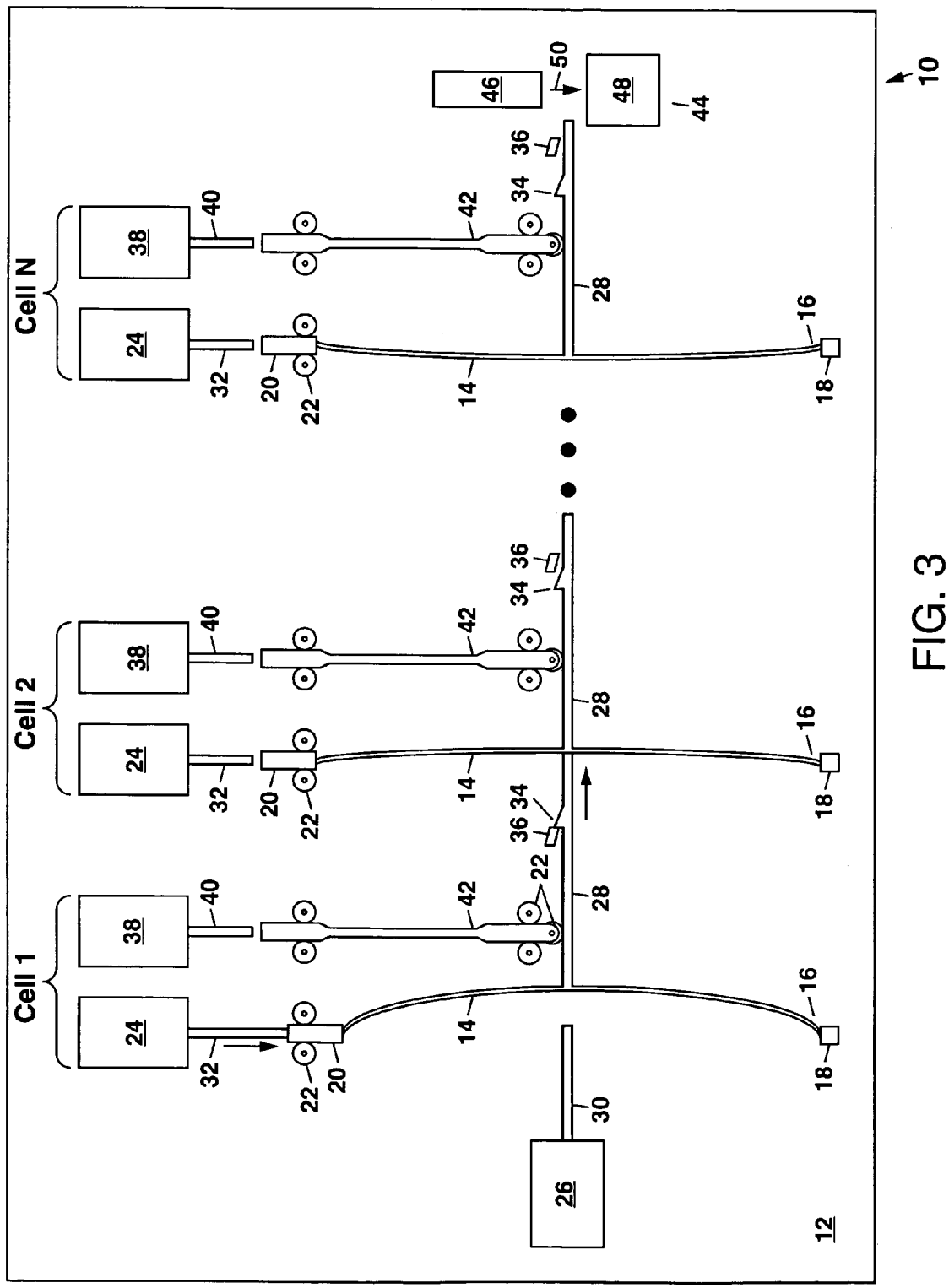

In FIG. 3, with the input arm 30 still contacting the leftmost beam 14 and holding the beam 14 in the "1" logic state, a clock displacement of the end 20 of the suspended beam 14 of Cell 1 can be produced using a clocking actuator 24 (also termed a bit shift actuator). The clocking actuator 24 can be an electrostatic comb actuator or a thermal actuator as will be described hereinafter. In other embodiments of the present invention, the clock displacement can be produced using a cam on a wheel.

When activated, the actuator 24 in FIG. 3 provides a clocking displacement via arm 32 to the moveable end 20 of the beam 14 in Cell 1. A small clocking displacement of the moveable end 20 results in a larger displacement of the midpoint of the beam 14 as the beam 14 is further bowed to the right. This moves the cantilevered beam 28 attached near the midpoint of beam 14 so that a catch 34 on the cantilevered beam 28 is engaged by a latch 36. Once latched, the "1" logic state can be stored Cell 1 in a nonvolatile state until the information is later erased (i.e. cleared and reset to the "0" logic state).

The movement of the cantilevered beam 28 in FIG. 3 also acts as a transmission rod to provide a programming force and input displacement to the beam 14 of a second memory cell (termed Cell 2). This switches the beam 14 of Cell 2, which was initially in the "0" logic state, to the "1" logic state as the beam 14 is bowed in an opposite direction from shown in FIG. 1. The "1" logic state is permanently stored in Cells 1 and 2 due to latching of the cantilevered beam 28 of Cell 1 until the logic state information stored in Cells 1 and 2 is shifted further to the right (e.g. to Cells 3, 4 . . . N) in a "bucket brigade" fashion, or until the information stored in Cells 1 and 2 is erased. A serial shifting of the stored information can be performed in the apparatus 10 of FIG. 1, by activating the bit shift actuators 24 of additional memory cells. Generally, this is done by activating the memory cells in a reverse order to read out the information from a last memory cell (i.e. Cell N), and then to shift the memory from each pair of memory cells to an adjacent pair of memory cells beginning with a next-to-last cell (i.e. Cell N-1) and ending with Cell 1. This allows each cell to be cleared (i.e. erased) by activating an erase actuator 38 prior to storing information from another cell therein. This also allows Cell 1 to be cleared so that new information can be entered into Cell 1. The apparatus 10 thus forms a nonvolatile double-buffered serial input/serial output shift register which can be use to store up to N/2 bits of information in N memory cells for later serial readout.

Figure 4:
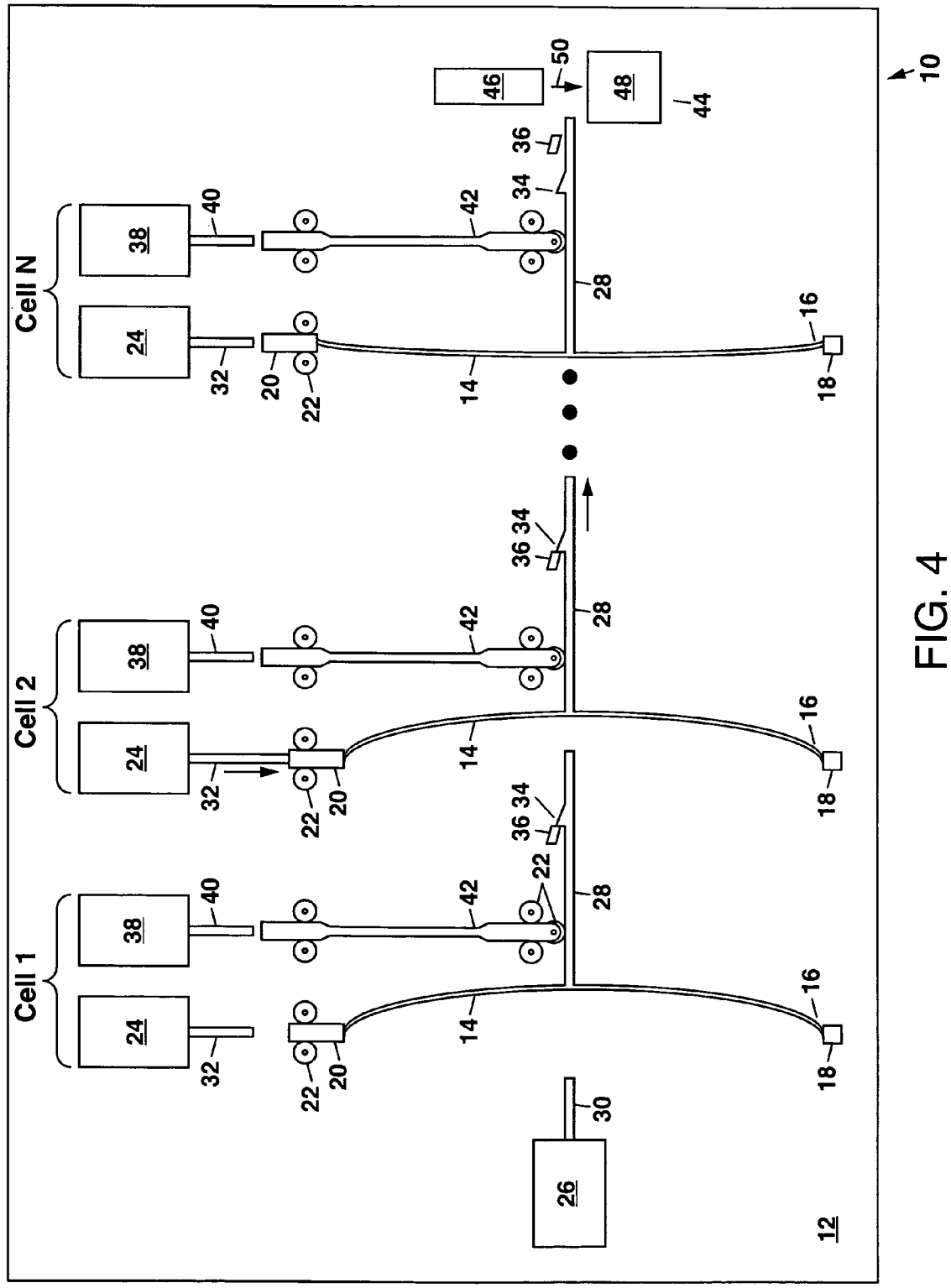

In FIG. 4, the arms 30 and 32 of the input actuator 26 and bit shift actuator 24 for Cell 1 can be returned to their initial positions. The bit shift actuator 24 for Cell 2 can then be activated to provide a clock displacement to the moveable end 20 of the beam 14 of Cell 2 to further bow the beam 14 and latch the cantilevered beam 28 in place. The cantilevered beam 28 also provides the programming force and input displacement to an adjacent memory cell (termed Cell 3) to the right of Cell 2, thereby switching the logic state of Cell 3 from "0" to "1".

Once the cantilevered beam 28 of Cell 2 has been latched in place to store the "1" logic state therein, the logic state information stored in Cell 1 can be cleared to allow new information to be inputted into Cell 1 using the input actuator 26. This is done by activating the erase actuator 38 of Cell 1 to extend an erase arm 40 that pushes against a latch release arm 42. The latch release arm 42 can have a roller 22 attached to one end thereof, with the roller 22 contacting the cantilevered beam 28 and pushing the beam 28 away from the latch 36. The cantilevered beam 28 can then ride against the roller 22 as the curved beam 14 springs back to its initial position of FIG. 1 (i.e. bowed to the left and in the "0" logic state). Cell 1 is now ready to be reprogrammed with the input actuator 26 to store new information therein.

The process described above can be repeated to input new logic state information (i.e. data) into Cell 1 and then serially shift the data from Cell 1 to Cell N. The data can then be serially read out of the mechanical memory from Cell N. Readout of the logic state information stored in the mechanical memory 10 can be performed in different ways for different embodiments of the present invention.

Figure 5:
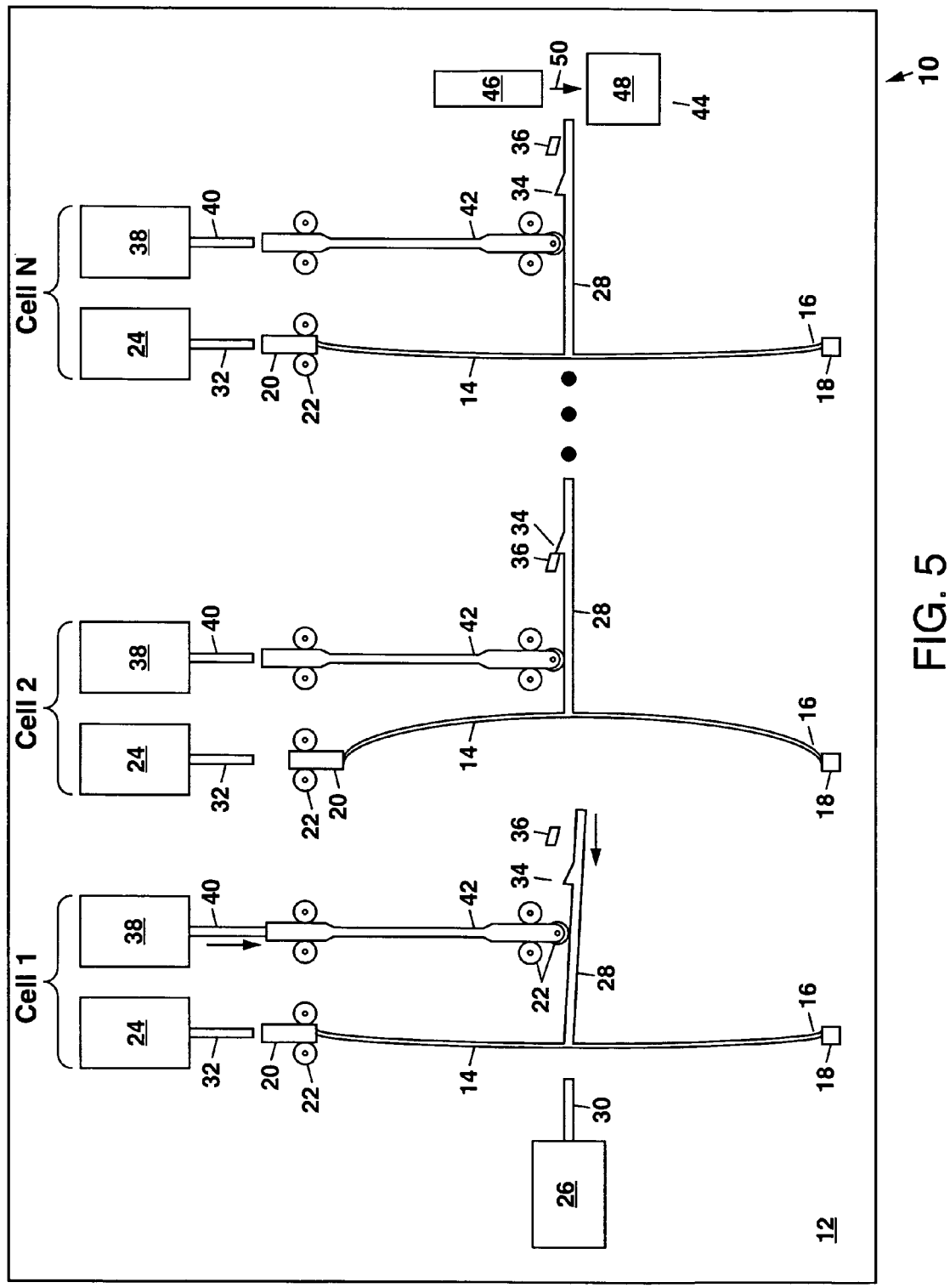
Figure 6:
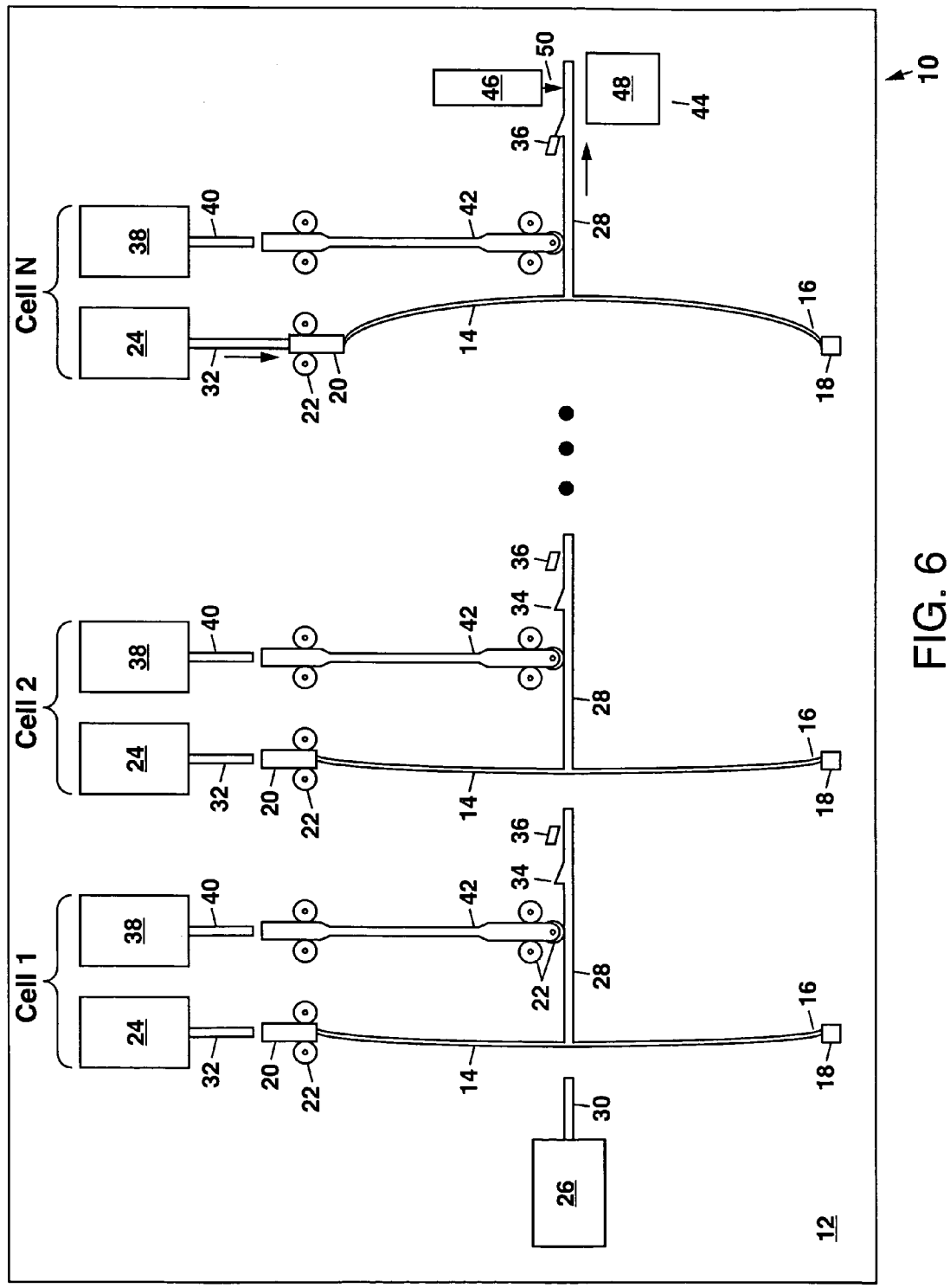

In the example of FIGS. 1–6, an optical data readout 44 is provided which comprises a light source 46 and a photodetector 48 both located on the substrate 12 on either side of a path for an output beam which can be the cantilevered beam 28 of the final memory cell, Cell N. Light 50 from the light source 46, which can be a light-emitting diode, a laser or a lamp, is incident on the photodetector 48 when Cell N stores a "0" logic state as shown in FIG. 5. The light 50 is blocked by the output beam when Cell N stores a "1" logic state as shown in FIG. 6. An electrical output signal from the photodetector 48 can thus be generated containing the logic state information as the information is serially read out from Cell N of the mechanical memory 10.

In other embodiments of the present invention, the light source 46, the photodetector 48 or both can be located off the substrate 12 with one or more optical fibers (not shown) being used to provide the light 50 across the path of the output beam. Alternately, the light source 46 and photodetector 48 can be located on the same side of the output beam with the light 50 being reflected off a surface of the output beam in the "1" logic state as the output beam moves to intercept the light 50. The light 50 is not reflected from the output beam for the "0" logic state since the output beam is not extended to intercept the light 50.

Those skilled in the art will understand that other arrangements are possible for the light source 46 and the photodetector 48. In other embodiments of the present invention, the logic state information stored in the mechanical memory 10 can be read out serially by using the output beam of Cell N to perform a switch closure, or to move one side of a capacitor. The capacitor can be a variable capacitor having one or more moveable capacitor plates operatively connected to the output beam, and one or more stationary capacitor plates supported on the substrate 12 and spaced apart from the moveable capacitor plates with a spacing between the stationary and moveable capacitor plates changing depending on whether a "0" logic state or a "1" logic state is being read out of the apparatus 10.

To input a "0" logic state in the mechanical memory 10 of FIG. 1, the input actuator 26 is not actuated to move the input arm 30 to the right (e.g. no voltage is applied to the input actuator 26). As a result, the beam 14 in Cell 1 remains bowed to the left. Activating the clocking actuator 24 for Cell 1 then further bows the beam 14 to the left leaving Cell 1 in the "0" state. As a result, the cantilevered beam 28 of Cell 1 does not engage with the latch 36 and does not contact the beam 14 of Cell 2 to switch the logic state of Cell 2. This leaves Cell 1 in the "0" state after activating the clocking actuator 24, and also leaves Cell 2 in whatever state it was in prior to activating the clocking actuator 24. If Cell 2 was initially in a "1" logic state, then after the logic state information in Cell 2 has been shifted to an adjacent Cell 3 and the erase actuator 38 is activated, then Cell 2 will spring back to the "0" logic state. This effectively transfers the "0" logic state from Cell 1 to Cell 2. On the other hand, if Cell 2 is initially in a "0" logic state prior to the transfer of the "0" logic state information from Cell 1 to Cell 2, then Cell 2 will remain in the "0" logic state. This also effectively transfers the "0" logic state information from Cell 1 to Cell 2. This process can be repeated for each additional memory cell to shift a "0" logic state from one memory cell to the next.

Figure 7:
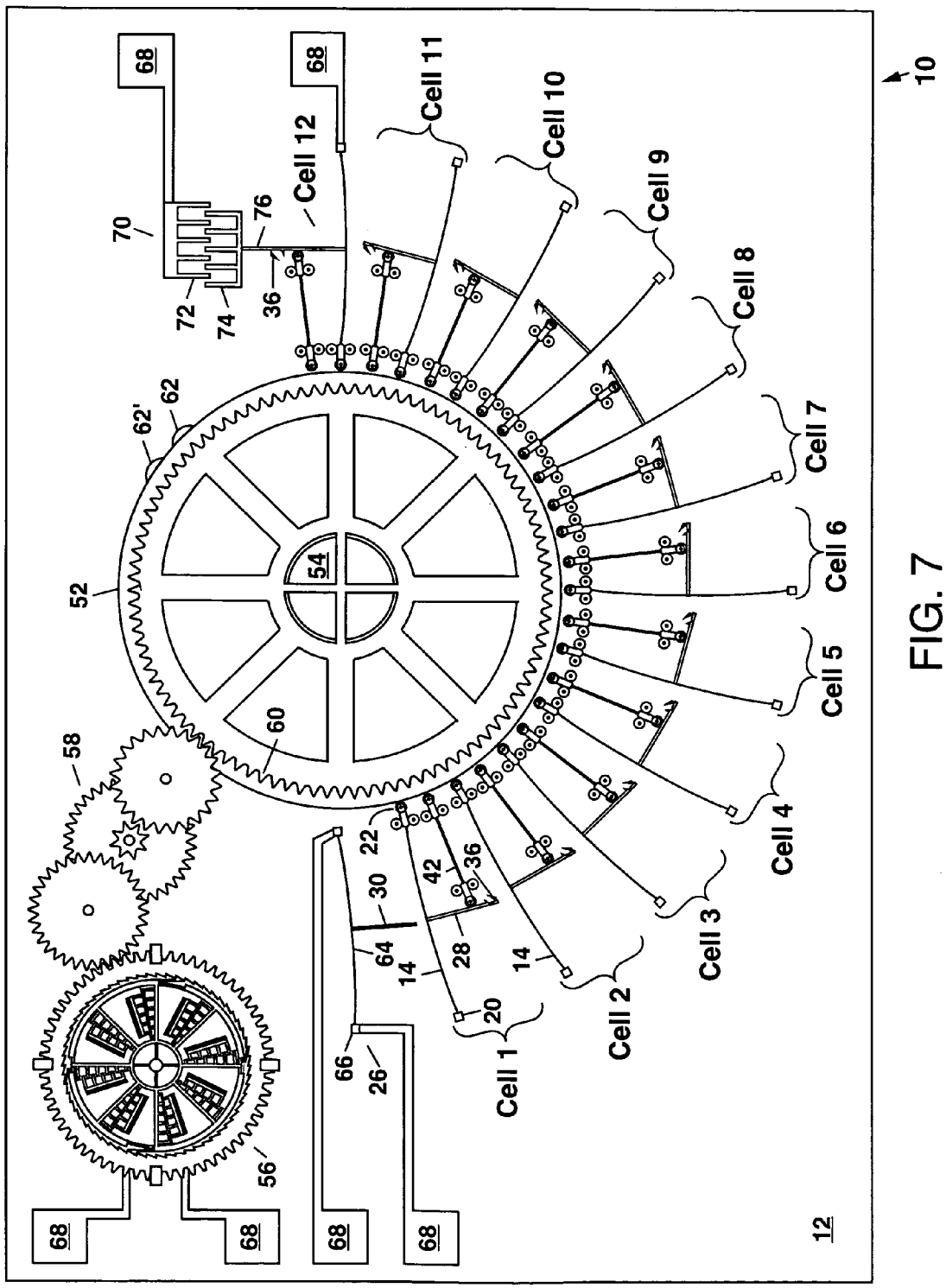
FIG. 7 shows a schematic plan view of a second example of the first-in-first-out microelectromechanical memory apparatus of the present invention.

Those skilled in the art will understand that the various actuators 24, 26 and 38 in FIGS. 1–6 herein can be electrically connected to contact pads on the substrate 12 through wiring formed on the substrate 12 (see FIG. 7). In FIGS. 1–6, the contact pads and wiring have been omitted for clarity. The actuators 24, 26 and 38 can be actuated with a voltage from an external source, with the voltage being, for example, in the range of 5–200 volts, and with the exact voltage depending upon various factors including the type of actuator (electrostatic or thermal), the programming force to be provided by the actuators, and an extent of movement of the arm 30, 32 or 40 of each actuator.

The first-in-first-out microelectromechanical memory apparatus 10 in the example of FIG. 1 can be formed using conventional surface micromachining. The various elements of the apparatus 10 including the beams 14 and 28, the anchors 18, latch 36, rollers 22, and the actuators 24, 26 and 38 can be built up layer-by-layer from a plurality of deposited and patterned layers of polycrystalline silicon (also termed polysilicon) on a silicon or silicon-on-insulator substrate 12. The substrate 12 can be initially prepared, for example, by forming a layer of a thermal oxide about 0.63 µm thick over exposed surfaces of the substrate 12 followed by an insulating layer of silicon nitride about 0.8 µm thick. The silicon nitride layer can be deposited using low-pressure chemical vapor deposition (LPCVD) at a deposition temperature of about 850° C.

A first layer of polysilicon (termed Poly-0) can then be blanket deposited over the substrate 12 by LPCVD at a temperature of about 580° C. and patterned to define electrical wiring and contact pads for the various actuators 24, 26 and 38 and for use in building up the anchors 18, latch 36, hubs about which the rollers 22 rotate, and other elements of the apparatus 10 which are to be attached to the substrate 12. The term "patterning" as used herein refers to a sequence of well-known processing steps including applying a photoresist to the substrate 12, prebaking the photoresist, aligning the substrate 12 with a photomask, exposing the photoresist through the photomask, developing the photoresist, baking the wafer, etching away the surfaces not protected by the photoresist (e.g. by reactive ion etching), and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by etching.

A layer of a sacrificial material (e.g. silicon dioxide or a silicate glass such as TEOS) about 2 µm thick can then be blanket deposited over the substrate 12 and planarized (e.g. by chemical-mechanical polishing) and then subsequently patterned to define features therein. The sacrificial material is used to separate the beams 14, the cantilevered beams 28, the various arms 30, 32, 40 and 42 and the rollers 22 from the substrate 12. Additionally, the sacrificial material can be patterned to form a mold wherein a subsequent polysilicon layer can be deposited to define elements of the apparatus 10 being built up including the beams 14 and 28, the arms 30, 32, 40 and 42, the rollers 22, and the actuators 24, 26 and 38. Additionally, recesses can be etched in the sacrificial material to form dimples underneath certain elements of the mechanical memory (e.g. the cantilevered beams 28 and the moveable ends 20 of the beams 14) so that these elements can ride over the surface of the substrate 12 with minimal surface contact to prevent adhesion (also termed stiction) to the substrate 12.

Additional layers of polysilicon and sacrificial material can be alternately deposited and then patterned to complete the buildup of the various elements of the mechanical memory 10 shown in FIG. 1. Each additional layer of polysilicon can be annealed at an elevated temperature (e.g. 1100° C. for several hours) to relieve any stress therein. Altogether, up to four or five layers of polysilicon can be used to fabricate the mechanical memory 10 of FIG. 1 by surface micromachining with an overall height of the surface micromachined elements of the apparatus 10 being about 10–12 microns. Once the structure of the device 10 has been completed, the various layers of the sacrificial material can be removed using a selective wet etchant comprising hydrofluoric acid (HF) which etches away the sacrificial material without chemically attacking the substrate 12 and the polysilicon and silicon nitride layers thereon. Additional details for fabricating microelectromechanical devices using four or five layer surface micromachining can be found in U.S. Pat. Nos. 6,082,208; 6,133,670; 6,211,599 and 6,313,562 which are incorporated herein by reference.

The light source 46 and the photodetector 48 can be formed separately and attached to the substrate 12 (e.g. with a conductive epoxy, or by wafer bonding). The light source 46, which can be formed from III–V or II–VI compound semiconductors, can be a light-emitting diode (LED) or a semiconductor laser.

FIG. 7 shows a schematic plan view of a second example of the mechanical memory 10 of the present invention. In this example of the mechanical memory 10, a plurality of beams 14 have been arranged about a wheel 52 to form a nonvolatile memory 10. The wheel 52 can be driven to rotate in a clockwise direction about a hub 54 by a microelectromechanical drive motor 56 (also termed a micromotor) which is operatively connected (e.g. through a gear train 58) to a gear 60 located on the wheel 52 which is formed from a plurality of stacked and interconnected layers of polysilicon. The wheel 52 with a pair of cams 62 and 62' located about the periphery of the wheel 52 at two different levels below the level of the gear 60 functions as a clocking actuator, replacing the numerous bit shift actuators 24 and erase actuators 38 in FIG. 1 and thereby simplifying construction of the mechanical memory 10.

A spacing between the cams 62 and 62' is predetermined so that the cam 62 provides a clock displacement to further bow each even-numbered memory cell (i.e. Cells 12, 10, 8, 6, 4, 2 in FIG. 7) as the wheel 52 is rotated in the clockwise direction from the position shown in FIG. 7. This allows logic state information to be stored in the even-numbered memory cells by latching the cantilevered beams 28 for these cells, and also transfers the logic state information to the next higher odd-numbered memory cell (i.e. Cells 11, 9, 7, 5 and 3). The cam 62 also provides a clock displacement that operates the latch release arms 42 of every odd-numbered memory cell (i.e. Cells 11, 9, 7, 5, 3 and 1) to erase the logic state information therein prior to transferring the logic state information from the next lower even-numbered memory cell (i.e. Cells 10, 8, 6, 4 and 2). In a similar manner, the other cam 62' provides a clock displacement that further bows each odd-numbered memory cell in turn to latch the cantilevered beams 28 of these cells and to transfer the logic state information therein to the next higher even-numbered memory cell after having erased the logic state information from each even-numbered memory cell.

Figure 8:
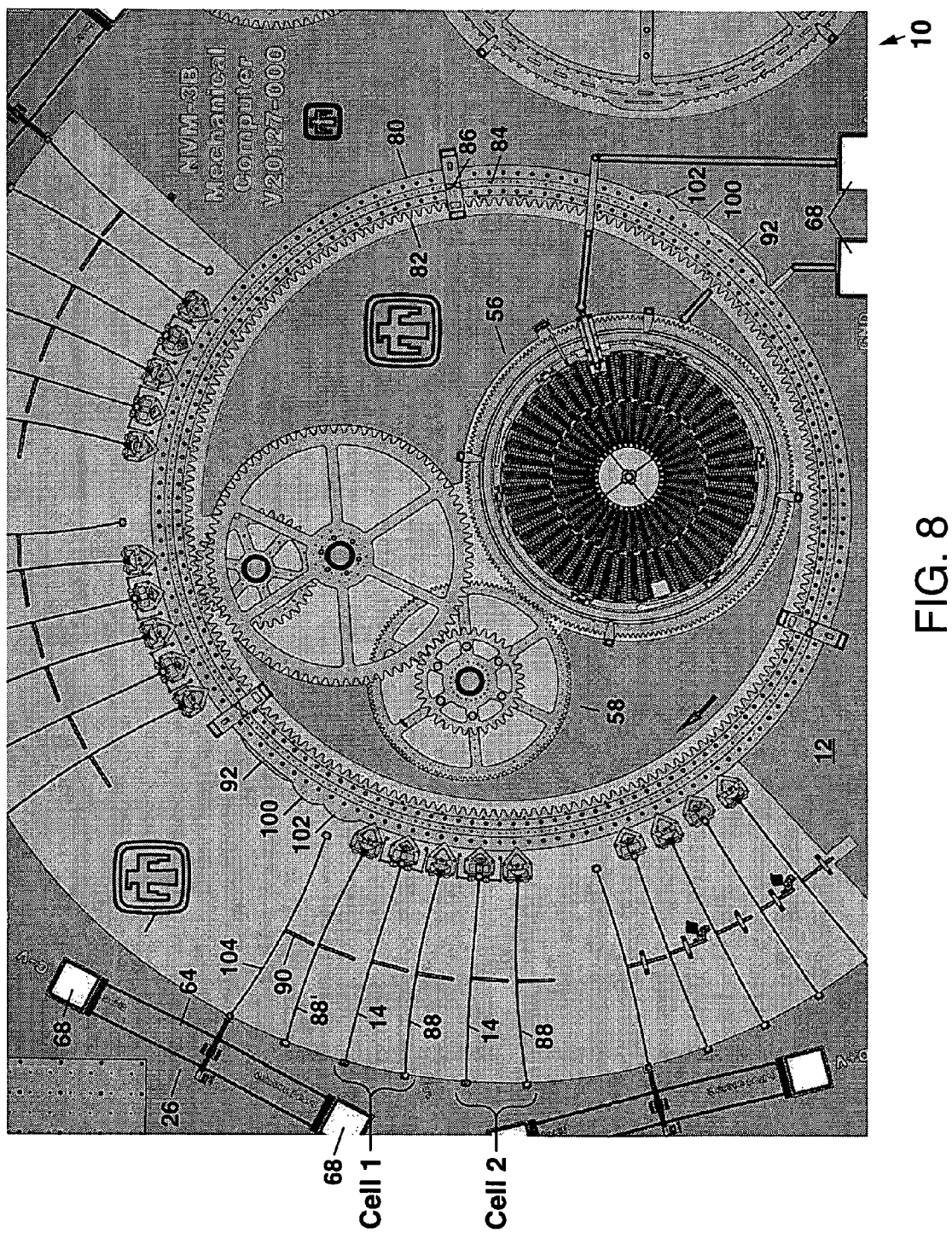
FIG. 8 shows an image of a third example of the first-in-first-out microelectromechanical memory apparatus of the present invention.

In the example of FIG. 7, the input actuator 26 is a thermal actuator which comprises a bent beam 64 which is suspended above the substrate 12 by a pair of support posts 66. The thermal actuator 26 is electrically connected to a pair of contact pads 68. When an electrical current is applied between the pair of contact pads 68 from an external source (not shown), the bent beam 64 is heated and expands. This further bends the beam 64 and moves an input arm 30 which is connected near a midpoint of the bent beam 64. An alternative arrangement for the thermal actuator is shown in FIG. 8.

The input arm 30 in FIG. 7 provides an input displacement and programming force to an adjacent beam 14 of a first memory cell (i.e. Cell 1) thereby changing the logic state of that cell from "0" to "1" as previously described with reference to FIG. 2. When the wheel 52 is rotated, the cam 62 does not provide any clock displacement or programming force to the beam 14 of Cell 1 since the cam 62 only contacts the beams 14 for the even-numbered memory cells. Furthermore cam 62 which operates as an erase actuator for Cell 1 by pressing against the latch release arm 42 of Cell 1 does not erase the logic state information from Cell 1 since Cell 1 has not been latched in position to store the "1" logic state therein. The "1" logic state is maintained in Cell 1 by action of the input actuator 26 with input arm 30 continuing to press against the midpoint of the beam 14 for Cell 1.

As the wheel 52 is further rotated, the cam 62' interacts with Cell 1, providing a clock displacement that further bows the beam 14 of Cell 1 which is in the "1" logic state. This latches Cell 1 in the "1" logic state as previously described with reference to FIG. 3, and also contacts the beam 14 of Cell 2 and switches Cell 2 from the "0" logic state to the "1" logic state as shown in FIG. 3. At this point, a first-entered bit of logic state information is stored in Cells 1 and 2, with the remaining memory cells in the device 10 of FIG. 7 being in the "0" logic state.

To shift the logic state information stored in Cells 1 and 2 to Cells 3 and 4 and to enter another bit of information into Cells 1 and 2, the wheel 52 is rotated through another complete revolution. When this is done, the cam 62 functions as a bit shift actuator and provides a clock displacement which further bows the beam 14 of Cell 2 to latch this memory cell in the "1" logic state, and also switches Cell 3 from the "0" logic state to the "1" logic state as the cantilevered beam 28 of Cell 2 contacts and pushes against the beam 14 of Cell 3 (see FIG. 4). Upon further rotation of the wheel 52, the cam 62 functions as an erase actuator to operate the latch release arm 42 of Cell 1 and erase the logic state information stored therein, with the beam 14 of Cell 1 reverting back to the "0" logic state due to a predisposition to bow in that direction resulting from the beam 14 being fabricated curved in the direction corresponding to the "0" logic state.

The other cam 62', which functions as the bit shift actuator for the odd-numbered memory cells, further bows the beam 14 of Cell 3 so that the cantilevered beam 28 of Cell 3 is latched in place by the latch 36 of Cell 3. This stores the "1" logic state in Cell 3. The cantilevered beam 28 of Cell 3 also presses against the beam 14 of Cell 4 to switch the beam 14 of Cell 4 from the "0" logic state to the "1" logic state. With further movement of the wheel 52 in the clockwise direction, the cam 62' functions as an erase actuator to operate the latch release arm 42 of Cell 2 and clear the logic state information stored therein, with the beam 14 of Cell 2 reverting back to the "0" logic state. At this point, further logic state information can be entered into Cells 1 and 2 using the input actuator 26 and the action of cam 62' operating as a bit shift actuator.

With each additional rotation of the wheel 52, the stored logic state information in the mechanical memory 10 of FIG. 7 is shifted to the right two bits at a time (i.e. double buffered) so that new logic state information can be read into the memory 10 using the input actuator 26. The logic state information stored in the mechanical memory 10 can be read out from a final memory cell, which in the example of FIG. 7 is Cell 12, with the logic state information stored in each adjacent pair of memory cells being transferred over time to the final memory cell (i.e. Cell 12).

In the example of FIG. 7, readout of the mechanical memory 10 can be performed using a variable capacitor data readout 70 which comprises one or more stationary capacitor plates 72 and one or more moveable capacitor plates 74. Each moveable capacitor plate 74 is operatively connected to the cantilevered beam 28 of Cell 12 which can be extended to form an output beam 76.

The variable capacitor 70 can comprise a plurality of interdigitated fingers forming a pair of meshed combs for the capacitor plates 72 and 74 as shown in FIG. 7. Alternately, the variable capacitor 70 can comprise a parallel-plate capacitor formed from a single moveable capacitor plate 74 which is substantially parallel to a single stationary capacitor plate 72. In either case, a change in capacitance of the variable capacitor 70 is used to read out the logic state information from Cell 12.

In the example of FIG. 7, when Cell 12 is switched from the "0" logic state to the "1" logic state, this moves the output beam 76 and moveable capacitor plate 74 towards the stationary capacitor plate 72, thereby producing a change in capacitance which can be electrically sensed (e.g. as a change in current flowing through the variable capacitor 70) to read out the logic state information contained in the mechanical memory 10. The stationary capacitor plate 72 can be electrically connected to a contact pad 68 as shown in FIG. 7. The moveable capacitor plate 74 can be connected through the beams 76 and 14 and the anchor 20 to another contact pad 68, with the moveable capacitor plate 76 and the other elements 76, 14 and 20 as well as the wheel 52 generally being electrically grounded.

The example of the mechanical memory 10 in FIG. 7 can be fabricated using surface micromachining as described previously. Each beam 14 can be formed with a predetermined amount of curvature to provide a predisposition to return to the "0" logic state in the absence of any applied forces. The beams 14 can be, for example, 500 µm long×2–4 µm wide and 8–12 µm high formed from up to 4 or 5 stacked and interconnected layers of polysilicon. The micromotor 56, wheel 52, hub 54, gear 60 and gear train 58 can also be built up from 4–5 stacked and interconnected polysilicon layers, with the wheel 52 in the example of FIG. 7 having a diameter of 750 µm.

The cams 62 and 62' are be formed from different layers of polysilicon, with a vertical separation between the cams 62 and 62' being, for example, 2 µm and with each cam 62 and 62' being 2–3 µm thick and protruding out from the wheel 52 by 10–20 µm. The rollers 22 which come into contact with the cams 62 and 62' are also formed from different layers of polysilicon so that each roller 22 is only contacted by one of the cams 62 and 62'. Each roller 22 which contacts the cams 62 and 62' can have a diameter of, for example, 50 µm and can be held within a cage 78 (see FIG. 9). The remaining rollers 22, which rotate but do not move laterally, can be supported on axles which are attached to the substrate 12.

The micromotor 56 can be any type of microelectromechanical motor known to the art. The micromotor 56 shown in FIG. 7, which is also referred to as a torsional ratcheting actuator, comprises a ring gear. Inside the ring gear are a plurality of electrostatic comb actuators. One side of a moveable electrostatic comb of each electrostatic comb actuator is springingly attached to the substrate 12 for rotation over a limited angle of a few degrees (e.g. 8 degrees). The other side of each moveable electrostatic comb is attached to a ring containing a plurality of ratchet pawls which engage with ratchet teeth on the inside of the ring gear. An alternating voltage (e.g. a square-wave voltage) can be applied to the micromotor 56 in FIG. 7 through contact pads 68. This activates the plurality of electrostatic comb actuators to repeatedly move the ratchet pawls back and forth to rotate the ring gear. Mechanical power produced by the micromotor 56 is then coupled through the gear train 58 and gear 60 to rotate the wheel 52. Additional details of the micromotor 56 in FIG. 7 can be found in U.S. Pat. Nos. 6,211,599 and 6,313,562 which are incorporated herein by reference. In other embodiments of the present invention, one or more thermal actuators can be substituted for the electrostatic comb actuators in the micromotor 56.

FIG. 8 shows an image of a third example of a mechanical memory 10 according to the present invention. In this example, the micromotor 56 and gear train 58 are located inside an annular wheel 80 which includes a ring gear 82 formed on an inner edge of the annular wheel 80. The micromotor 56 can be activated with a drive voltage applied between a pair of contact pads 68 to rotate the annular wheel 80 in a clockwise direction as indicated by the arrow in FIG. 8. The annular wheel 80 also includes a slot 84 which engages with a plurality of guides 86 to keep the wheel 80 on track as it is rotated and thereby minimize any lateral or vertical movement of the wheel 80.

In FIG. 8, a plurality of memory cells are located about the periphery of the annular wheel 80 to store logic state information input by a thermal actuator 26. Each memory cell comprises a pair of suspended beams including a curved beam 14 and a data transfer beam 88. Another data transfer beam 88' can also be located between an input beam 90 and the beam 14 of a first memory cell (termed Cell 1). Each data transfer beam 88 can be about twice as stiff as the beams 14. The larger stiffness of the data transfer beams 88 can be provided by making each data transfer beam 88 with twice the width or height of the beams 14, or alternately by making each data transfer beam 88 shorter in length than the beams 14. Each data transfer beam 88 is also fabricated with a small amount of lateral bowing therein, with the bowing being in the clockwise direction for rotation of the annular wheel 80 (i.e. corresponding to a "0" logic state). This provides a predisposition for the data transfer beams 88 to revert (i.e. spring back) to the "0" logic state in the absence of any external forces acting upon them. When one of the data transfer beams 88 is bowed oppositely to the direction wherein the beam 88 was initially formed (i.e. an as-formed direction), this produces an internal stress in the beam 88 so that the beam 88 will spring back to the as-formed direction once all external forces are removed.

Each beam 14, on the other hand, is formed with a smaller amount of bowing than the data transfer beams 88. This aids in initially bowing the beams 14 and latching them in place as described hereinafter. Once the beams 14 are bowed and latched in place, the beams 14 can have about the same amount of bowing as the data transfer beams 88, but will not have a predisposition to spring back to a particular direction of bowing (i.e. to the "0" logic state) in the absence of any externally-applied force (i.e. a programming force). Thus, the beams 14 are bistable.

Figure 9:
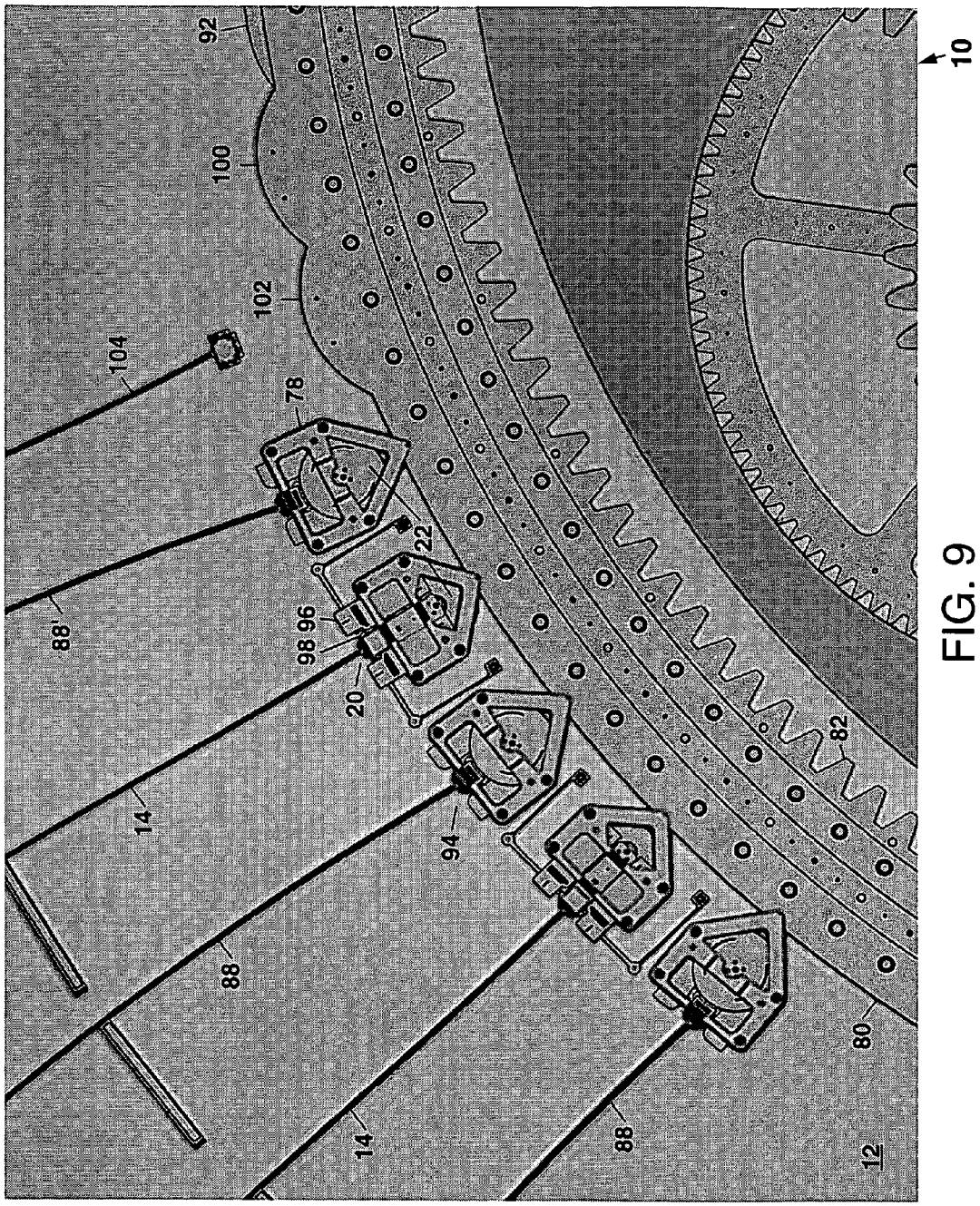
FIG. 9 shows an enlarged image of a portion of the device of FIG. 8.

Latching of the beams 14 to provide about the same bowing as the data transfer beams 88 can be performed when the annular wheel 80 is first rotated through a complete revolution using a first cam 92 located an the periphery of the annular wheel 80. In FIG. 9 an enlarged image of the moveable ends 20 and 94 of the beams 14 and 88, respectively, is shown. Each beam 14 and 88 includes a roller 22 that is operatively connected to the moveable end 20 or 94, respectively. The rollers 22 and moveable ends 20 and 94 are also constrained by a cage 78 attached to the substrate 12 so that the rollers 22 are free to rotate and so that the moveable ends 20 and 94 can only move in a longitudinal direction. A spring latch 96 is also provided for each beam 14 to capture and hold the moveable end 20 when the end 20 is first moved longitudinally by the cam 92. The spring latch 96 engages a pair of teeth 98 formed on the sides of the moveable end 20 to latch the beams 14 when the beams 14 are initially bowed by action of the cam 92. As a result, the beams 14 do not exhibit a predisposition to revert back to a particular direction of bowing in which they were initially formed or in which they exist after they have been latched in place by the spring latch 96. The beams 14, therefore, can retain a particular "0" or "1" logic state indefinitely until they are actively bowed in an opposite direction using a programming force.

The first cam 92 operates only on the curved beams 14 and not on any of the data transfer beams 88 and 88' since the rollers 22 for the beams 14 are at a level below the rollers 22 for the data transfer beams 88 and 88'. The first cam 92 is also at a level below a second cam 100 and a third cam 102 which both operate on the data transfer beams 88 and 88'. The second cam 100 acts as a bit shift actuator (also termed a clocking actuator) to shift the logic state information stored in each memory cell to a higher memory cell. The third cam 102 acts as an erase actuator to erase (i.e. reset to the "0" logic state) each memory cell prior to loading new logic state information therein.

Operation of the third example of the mechanical memory of the present invention will now be described.

Digital data is input into the mechanical memory 10 using the input actuator 26. This is done by applying an electrical current between the contact pads 68 of the input thermal actuator 26 to input a "1" logic state. In the actuator 26, a pair of bent beams 64, which are linked together at their midpoints, are heated by the electrical current and expand towards the annular wheel 80. The expansion of the bent beams 64 pushes against a moveable end of another bent beam 104 thereby compressing the bent beam 104 and bowing it which causes the input arm 90 to provide a programming force and input displacement to the data transfer beam 88' thereby switching the data transfer beam 88' in the same direction of bowing as the beam 104. When the second cam 100 contacts the moveable end of the data transfer beam 88', the cam 100 provides a programming force that compresses the beam 88' causing the beam 88' to further bow and thereby switch the beam 14 of Cell 1 to the "1" logic state when the beam 14 is initially in the "0" logic state. This stores the "1" logic state in Cell 1.

When a "0" logic state is to be inputted into the mechanical memory 10, no electrical current is applied to the input actuator 26 with the result that no deflection of the input arm 90 or the data transfer beam 88' occurs. In the event that the beam 14 of Cell 1 is already in the "0" logic state, the beam 14 will remain in the "0" logic state. If the beam 14 of Cell 1 was initially in the "1" logic state, then the "1" logic state will be transferred to Cell 2 and then the beam 14 of Cell 1 will be reset to the "0" logic state as will be described hereinafter.

The transfer of data from Cell 1 to Cell 2 can be understood with reference to FIGS. 10A–10F which show simplified diagrams of a portion of the apparatus 10 with certain elements including the spring latches 96, input beam 90 and data transfer beam 88' omitted since these elements are not needed to understand the transfer of data from Cell 1 to Cell 2. Additionally, a portion of the annular wheel 80 containing the cams 92, 100 and 102 is shown as straight instead of curved to simplify the drawing of FIGS. 10A–10F.

Figure 10A:
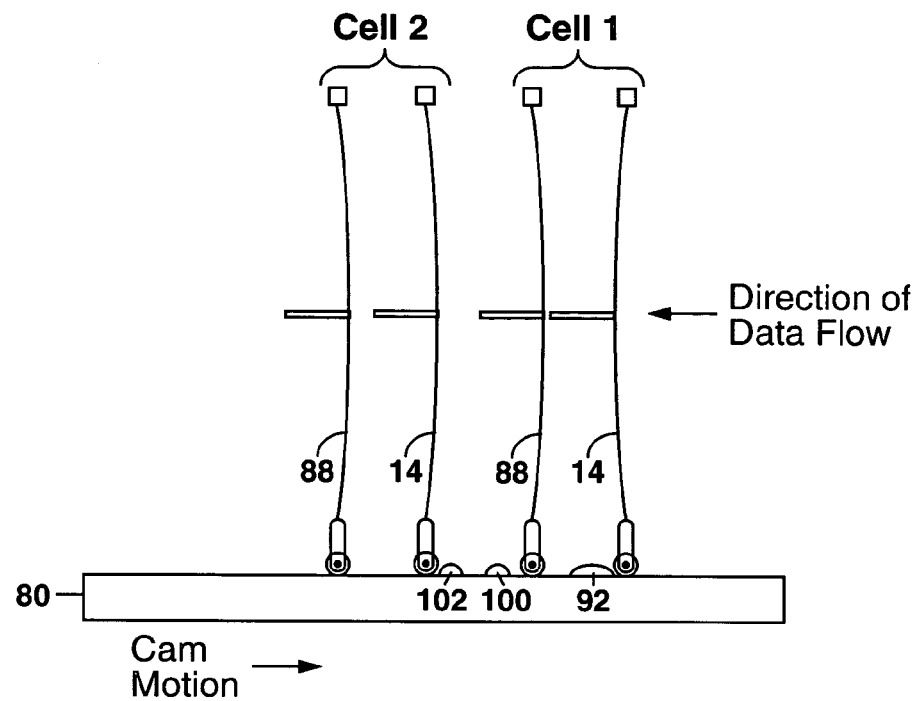
FIGS. 10A–10F show schematic diagrams to illustrate operation of the device of FIG. 8.

In FIG. 10A, Cell 1 is shown initially storing a "1" logic state after having been programmed as described above since the beam 14 is bowed in a direction opposite that of the movement of the wheel 80 and cams 92, 100 and 102. Cell 2 is initially shown initially storing a "0" logic state. The "1" logic state for the curved beams 14 in FIGS. 10A–10F also corresponds to bowing of each beam 14 in a data flow direction as indicated in FIGS. 10A–10F. This is consistent with the nomenclature for the logic states used previously for FIGS. 1–6 although the data flow direction in FIGS. 10A–10F is opposite that shown in FIGS. 1–6. Also, it is to be noted that the first cam 92 acts only on the beams 14 of each memory cell while the second and third cams 100 and 102, respectively, act only upon the data transfer beams 88 and 88'.

Figure 10B:
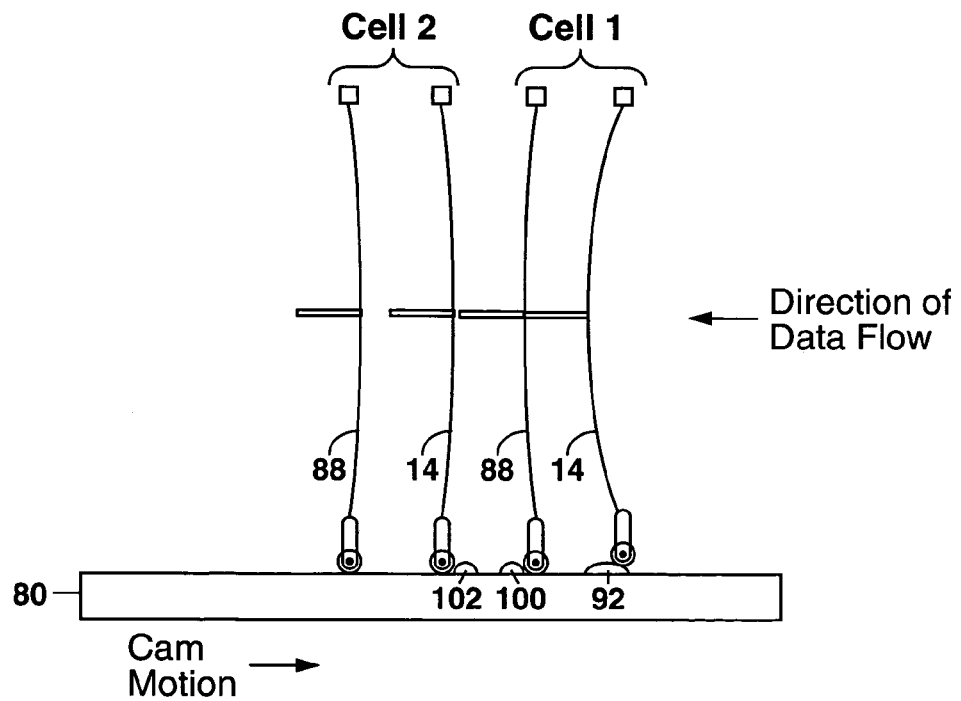

In FIG. 10B, the first cam 92 is moved into position contacting the roller 22 of the beam 14 of the Cell 1 and further bows the beam 14. The beam 14 of Cell 1 provides a programming force and input displacement to the data transfer beam 88 in Cell 1 which switches the direction of bowing of the data transfer beam 88 in Cell 1 to the "1" logic state.

Figure 10C:
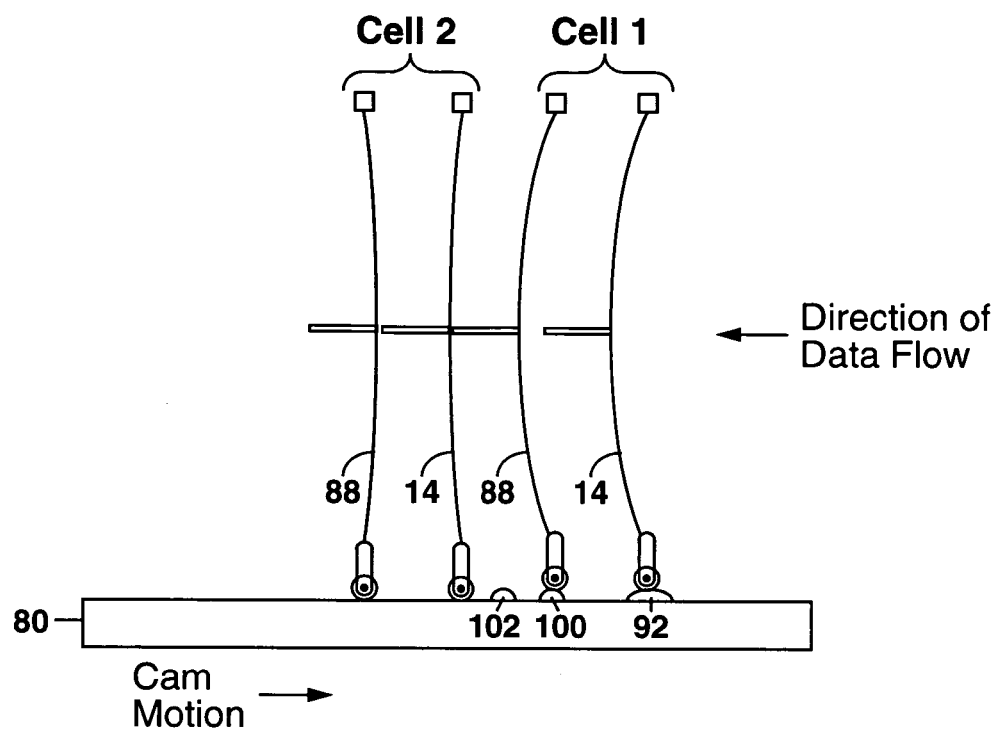

In FIG. 10C, upon further rotation of the annular wheel 80, the first cam 92, which is wider than the second and third cams 100 and 102, continues to hold the data transfer beam 88 of Cell 1 in the "1" logic state while the second cam 100 provides a programming force to the moveable end of beam 88 which produces a further bowing of the data transfer beam 88 of Cell 1. This provides a programming force and input displacement to the beam 14 of Cell 2 which transfers the "1" logic state from Cell 1 to Cell 2.

Figure 10D:
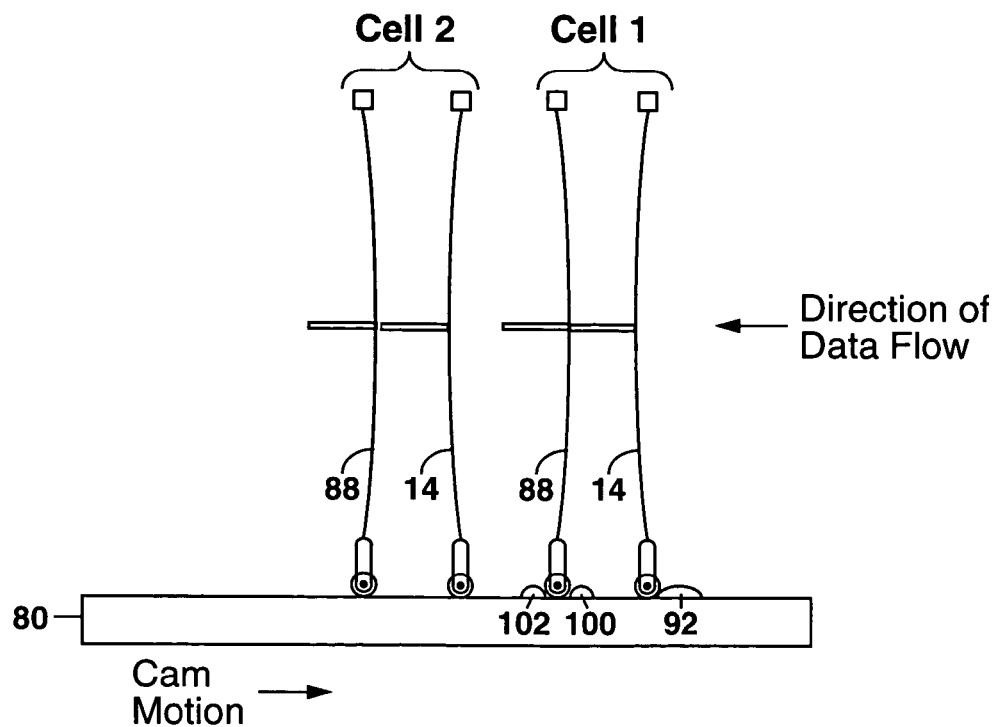

In FIG. 10D, a further rotation of the annular wheel 80 moves the second cam 100 so that it no longer presses against the data transfer beam 88 of Cell 1. At this point, the data transfer beam 88 of Cell 1 switches back to the "0" logic state due to the predisposition for the data transfer beams 88 to revert to the "0" logic state in the absence of any external forces acting upon them. The beam 14 of Cell 2, which does not have this same predisposition, remains in the "1" logic state.

Figure 10E:
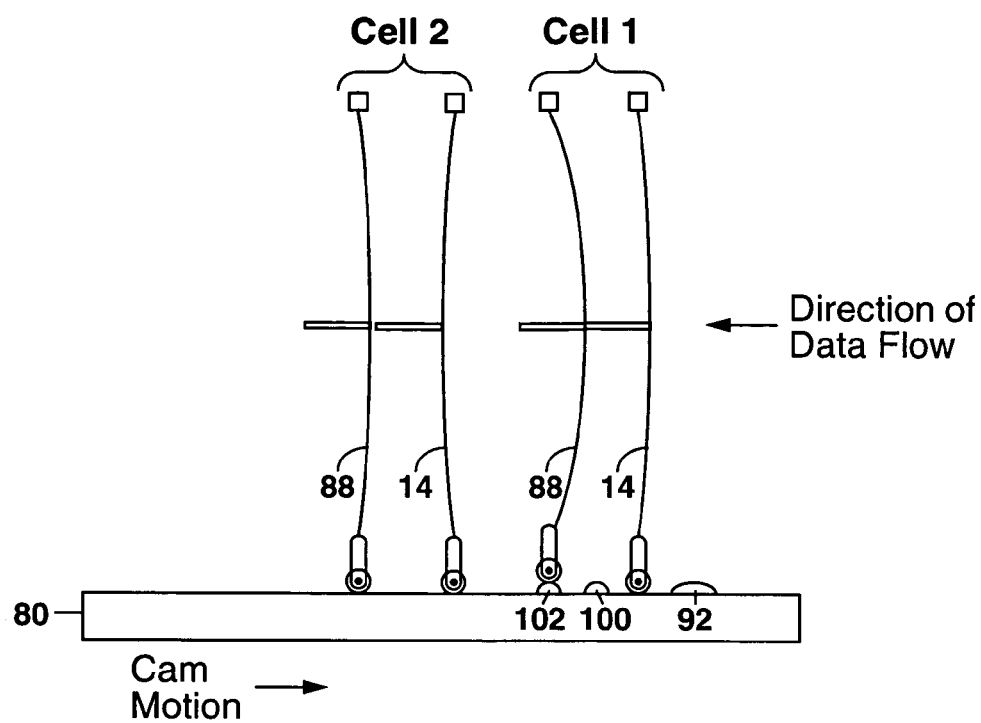

In FIG. 10E, with a still further rotation of the annular wheel 80, the third cam 102 presses against the moveable end of the data transfer beam 88 of Cell 1. This further bows the beam 88 in the "0" logic state direction and switches the beam 14 of Cell 1 from the "1" logic state to the "0" logic state, thereby erasing the "1" logic state from Cell 1 and preparing Cell 1 to receive additional logic state information to be inputted by the thermal actuator 26.

Figure 10F:
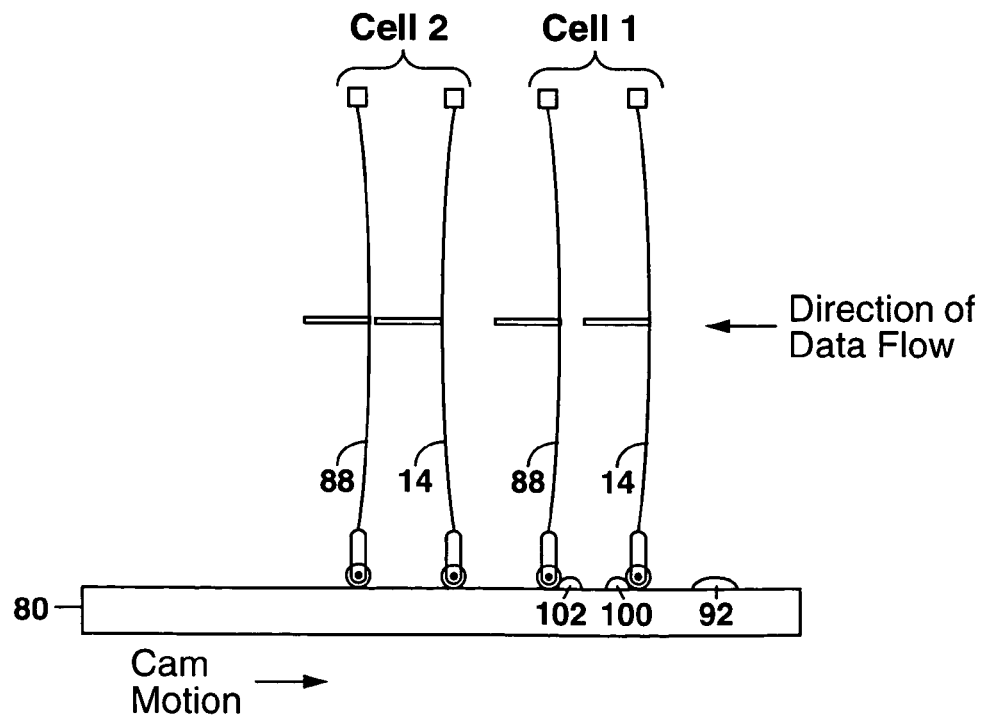

In FIG. 10F, once the third cam 102 has bypassed the data transfer beam 88 of Cell 1, the data transfer beam 88 relaxes back to its initial position of FIG. 10A. The beam 14 of Cell 1 is now ready to accept a new input of data from the input actuator 26.

In the image of FIG. 8, a plurality of two-bit memories are shown located about the annular wheel 80 to study operation of the mechanical memory 10 of the present invention. Additionally, in FIG. 8, a data readout for the logic state information in Cell 2 has been omitted. Those skilled in the art will understand that, in other embodiments of the present invention, additional memory cells can be placed about the annular wheel 80 in FIG. 8 to form a multi-bit mechanical memory 10 having up to tens or more of individual memory cells. Furthermore, an optical or capacitance data readout from a last memory cell can also be provided in the device 10 of FIG. 8 in a manner similar to that described with reference to FIG. 7. In such a multi-bit mechanical memory 10, the logic state information stored in each memory cell can be shifted to a higher memory cell as described in FIGS. 10A–10F each time the cams 92, 100 and 102 move past each memory cell. Multiple sets of cams 92, 100 and 102 can also be spaced about the periphery of the annular wheel 80 so that multiple data transfer sequences can be performed for each rotation of the annular wheel 80. In the example of FIG. 8, two sets of cams 92, 100 and 102 are shown located on opposite sides of the annular wheel 80.

The mechanical memory 10 of the present invention can also be formed as a volatile memory. This can be done in the example of FIG. 8 by omitting the spring latch 96 and teeth 98 from the moveable end 20 of each beam 14, and instead using a bending actuator 106 to provide the initial bowing for each beam 14. This is shown schematically in FIG. 11 which illustrates a two-bit volatile memory which can be formed about a motor-driven annular wheel 80 as shown in FIG. 8.

Figure 11:
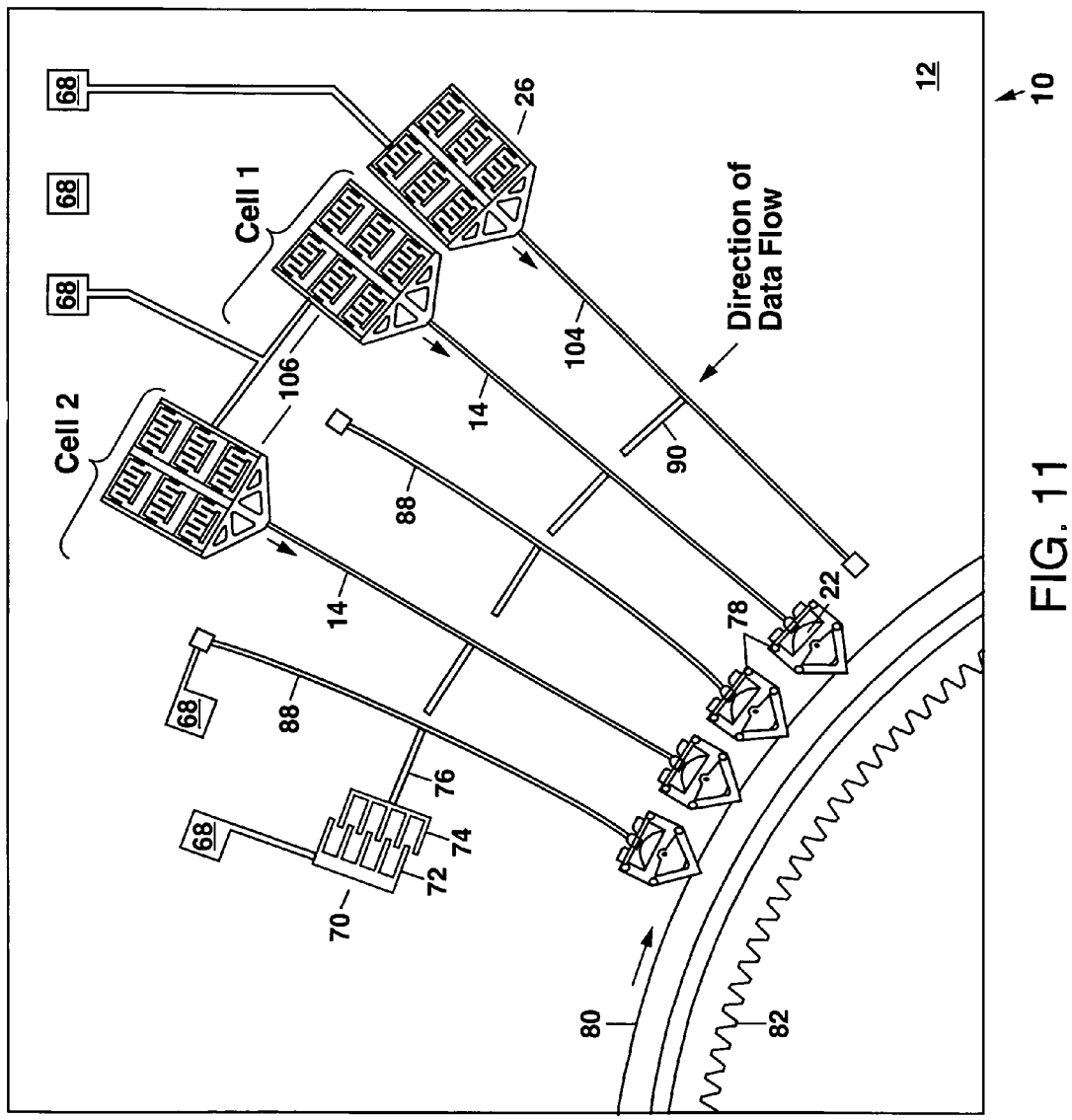
FIG. 11 shows a plurality of volatile memory cells which can be substituted for the memory cells in the device of FIG. 8 to form a volatile mechanical memory.

In FIG. 11, each beam 14 is formed with a very slight bowing which is much less than the initial bowing required to store logic state information in the beams 14. The bending actuators 106 are then activated with a voltage to initially bow the beams 14 in a predetermined direction (e.g. corresponding to the "0" logic state). The voltage used to activate each bending actuator 106 can be applied between a pair of contact pads 68 on the substrate 12, with one of the contact pads 68 forming a parallel electrical connection to each bending actuator 106, and with the other contact pad 68 being electrically connected to a ground plane or to the substrate 12. In this way, all the bending actuators 106 can be activated at the same time using a single applied voltage, and the information stored in all the beams 14 can be erased when the voltage is removed.

Each bending actuator 106 can be an electrostatic actuator such as an electrostatic comb actuator, which is shown schematically in FIG. 11, or alternately each bending actuator 106 can comprise a thermal actuator. Upon activation, each bending actuator 106 pushes against one end of the beam 14 to which the actuator 106 is connected. This generates the initial bowing for each beam 14 and prepares the beam 14 for storing logic state information therein. Once the bending actuators 106 have been activated, logic state information can be inputted into Cell 1 through an input actuator 26 as previously described with reference to FIGS. 8 and 9 and then transferred to Cell 2 (and any other memory cells in the apparatus 10) as previously described with reference to FIGS. 10A–10F.

In the mechanical memory 10 of FIG. 11, a variable capacitor data readout 70 is shown which comprises a plurality of stationary capacitor plates 72 and moveable capacitor plates 74, with the moveable capacitor plates 74 being operatively connected to an output beam 76 on the data transfer beam 88 of a final memory cell. In the example of FIG. 11, only two memory cells (Cell 1 and Cell 2) are shown. In other embodiments of the present invention, additional memory cells can be added in the device of FIG. 11 spaced about the annular wheel 80. Other types of data readout can also be used including an optical data readout 44 as previously described with reference to FIGS. 1–6. The data readout can also be a switch closure.

In other embodiments of the present invention, data entry and data readout can be performed purely mechanically with no need for electrical power, or for an electrical input actuator 26. As an example, data entry can be performed using an input arm which is operatively connected to a mechanical drive source (e.g. a mass which moves back and forth in response to each acceleration and deceleration); and data readout can be performed using an output arm that mechanically moves depending upon whether a "0" or "1" logic state is being read out of the apparatus 10. The output arm can be operatively connected to interrupt a light beam (e.g. coupled through free space or optical fibers), or to start and stop or drive another mechanical device located on the substrate 12 in response to the logic state information being read out of the mechanical memory 10.

Returning to the example of FIG. 11, when electrical power to the mechanical memory 10 is removed, the bending actuators 106 spring back to their initial positions due to each curved beam 14 which acts as a spring and also due to a spring action within the bending actuators 106. This erases the logic state information stored within the various memory cells, thereby forming a volatile memory. Restoring electrical power to the mechanical memory 10 in FIG. 11 resets each memory cell to the "0" logic state and again prepares the device 10 for use as described above.

The examples of the mechanical memory 10 of the present invention shown in FIGS. 8, 9 and 11 can be fabricated using surface micromachining as previously described for the first and second examples of the present invention. Electrostatic comb actuators as shown in FIG. 11 are well known in the art and need not be described herein in detail (see U.S. Pat. No. 6,133,670 which is incorporated herein by reference).

The matter set forth in the foregoing description and accompanying drawings is offered by way of illustration only and not as a limitation. The actual scope of the invention is intended to be defined in the following claims when viewed in their proper perspective based on the prior art.

The invention claimed is:

1. A first-in-first-out (FIFO) microelectromechanical memory apparatus, comprising:
   (a) a substrate;
   (b) a plurality of memory cells located on the substrate, with each memory cell further comprising:
      (i) a suspended beam capable of being bowed in either of two opposite directions substantially parallel to the plane of the substrate, with each direction of bowing of the suspended beam representing a different logic state, and
      (ii) a data transfer beam extending outward from each suspended beam proximate to a midpoint thereof to transfer logic state information from one of the memory cells to an adjacent memory cell; and
   (c) an input actuator to program the logic state of an input memory cell of the plurality of memory cells.

2. The apparatus of claim 1 wherein the input actuator comprises a thermal actuator or an electrostatic actuator.

3. The apparatus of claim 1 further comprising a clocking actuator to initiate the transfer of the logic state information from one of the memory cells to the adjacent memory cell.

4. The apparatus of claim 3 wherein the clocking actuator comprises a wheel having a plurality of cams extending outward from an edge of the wheel to push against a moveable end of each suspended beam to initiate the transfer of the logic state information from that suspended beam to an adjacent suspended beam.

5. The apparatus of claim 4 wherein the clocking actuator further comprises a micromotor operatively connected to rotate the wheel.

6. The apparatus of claim 3 further comprising means for sequentially reading out the logic state information from the plurality of memory cells.

7. The apparatus of claim 6 wherein the means for sequentially reading out the logic state information comprises a light source for generating light, and a photodetector for sensing a change in the intensity of the light reaching the photodetector as the light is blocked and unblocked by movement of the data transfer beam of a final memory cell as the logic state of the final memory cell is changed over time, with the photodetector producing an electrical output signal containing the logic state information.

8. The apparatus of claim 6 wherein the means for sequentially reading out the logic state information comprises a capacitor having at least one stationary capacitor plate and at least one moveable capacitor plate located proximate to the stationary capacitor plate, with the moveable capacitor plate being operatively connected to the data transfer beam of a final memory cell to change the capacitance of the capacitor in response to a change in the logic state of the final memory cell.

9. The apparatus of claim 1 wherein each memory cell includes a bending actuator operatively connected to one end of the suspended beam to initially bow the suspended beam and thereby program an initial logic state therein upon activation of the actuator, and to at least partially unbow the suspended beam and thereby erase any logic state therein upon deactivation of the actuator.

10. The apparatus of claim 9 wherein the actuator comprises a thermal actuator or an electrostatic actuator.

11. The apparatus of claim 1 wherein each memory cell includes a latch to capture and hold one end of each suspended beam to initially bow the suspended beam and thereby program an initial state therein.

* * * * *